(12) United States Patent
Chapelon (10) Patent No.: US 8,890,276 B2
(45) Date of Patent: Nov. 18, 2014

(54) THREE-DIMENSIONAL INTEGRATED STRUCTURE CAPABLE OF DETECTING A TEMPERATURE RISE

(71) Applicant: STMicroelectronics (Crolles 2) SAS, Crolles (FR)

(72) Inventor: Laurent-Luc Chapelon, Domene (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/934,683

(22) Filed: Jul. 3, 2013

(65) Prior Publication Data

US 2014/0015088 A1    Jan. 16, 2014

(30) Foreign Application Priority Data

Jul. 12, 2012    (FR) ...................................... 12 56724

(51) Int. Cl.
*H01L 31/058* (2006.01)
*H01L 27/04* (2006.01)
*H01L 21/66* (2006.01)
*G01K 5/56* (2006.01)
*H01L 23/00* (2006.01)

(52) U.S. Cl.
CPC ....... *H01L 27/04* (2013.01); *H01L 24/05* (2013.01); *H01L 2224/80896* (2013.01); *H01L 22/34* (2013.01); *H01L 2224/08147* (2013.01); *H01L 24/08* (2013.01); *H01L 2224/80895* (2013.01); *H01L 2224/80357* (2013.01); *G01K 5/56* (2013.01); *H01L 24/80* (2013.01); *H01L 2224/08111* (2013.01); *H01L 2224/08057* (2013.01); *H01L 2224/80012* (2013.01); *H01L 2224/0603* (2013.01); *H01L 2224/80097* (2013.01); *H01L 2224/05571* (2013.01); *H01L 2224/06102* (2013.01); *H01L 2224/05546* (2013.01)
USPC ............................ 257/467; 257/737; 438/459

(58) Field of Classification Search
USPC ........... 257/467, 737, 774, E23.011; 438/459
See application file for complete search history.

(56) References Cited

U.S. PATENT DOCUMENTS

| | | | |
|---|---|---|---|
| 2006/0122565 A1 | 6/2006 | Kooi | |
| 2007/0273463 A1 | 11/2007 | Yazdi | |
| 2008/0006938 A1 | 1/2008 | Patti et al. | |
| 2008/0067689 A1 | 3/2008 | Barth | |
| 2012/0001330 A1* | 1/2012 | Huisinga et al. | 257/751 |
| 2012/0267788 A1* | 10/2012 | Hong et al. | 257/774 |
| 2013/0020704 A1* | 1/2013 | Sadaka | 257/741 |
| 2013/0320556 A1* | 12/2013 | Liu et al. | 257/774 |
| 2014/0117546 A1* | 5/2014 | Liu et al. | 257/751 |

FOREIGN PATENT DOCUMENTS

EP    2202767 A1    6/2010

OTHER PUBLICATIONS

INPI Search Report and Written Opinion for FR 1256724 mailed Apr. 11, 2013 (9 pages).

* cited by examiner

*Primary Examiner* — Phuc Dang
(74) *Attorney, Agent, or Firm* — Gardere Wynne Sewell LLP (57) ABSTRACT

A three-dimensional integrated structure is formed from a first integrated circuit with a first cavity filled with a first conductive material and a second integrated circuit with a second cavity filled with a second conductive material, the second cavity facing the first cavity. The filled first cavity forms a first element and the filled second cavity forms a second element, the first and second elements separated from each other by a cavity. The first and second conductive materials have different thermal expansion coefficients. A contact detection circuit is electrically connected to the filled first and second cavities, and is operable to sense electrical contact between the first and second conductive materials in response to a change in temperature.

19 Claims, 8 Drawing Sheets

THREE-DIMENSIONAL INTEGRATED STRUCTURE CAPABLE OF DETECTING A TEMPERATURE RISE

PRIORITY CLAIM

This application claims priority from French Application for Patent No. 1256724 filed Jul. 12, 2012, the disclosure of which is incorporated by reference.

TECHNICAL FIELD

The invention relates to three-dimensional integrated structures, and more particularly to the integrated structures comprising directly bonded integrated circuits.

BACKGROUND

The integrated structures comprising directly bonded integrated circuits are produced, for example, by the association of at least two integrated circuits produced independently and assembled without the addition of adhesive material via direct bonding, or molecular bonding. After the formation of an interconnect network, generally designated by the person skilled in the art by the acronym BEOL (Back End Of Line), the free face of such an interconnect network is bonded directly against the free face of another interconnect network of another integrated circuit. Electrical connections are formed between the two integrated circuits when the metallic lines of the highest level of metallization of one integrated circuit are arranged facing metallic lines of the highest level of metallization of another integrated circuit.

SUMMARY

According to one embodiment, a three-dimensional integrated structure is proposed which is capable of detecting a temperature rise, and does so without requiring profound structural changes to the integrated structure, or major changes to the fabrication method.

According to one aspect, a three-dimensional integrated structure is proposed which comprises a first integrated circuit comprising a plurality of first bump contacts formed in an insulating region of the first integrated circuit flush with a first face of the insulating region of the first integrated circuit, a second integrated circuit comprising a plurality of second bump contacts formed in an insulating region of the second integrated circuit all, except for at least one of them, flush with a first face of the insulating region of the second integrated circuit, the two integrated circuits being mutually attached by the two first faces so that each first bump contact is facing a second bump contact, said at least one non-flush bump contact of the second integrated circuit and the first bump contact facing said at least one non-flush bump contact respectively forming a first element and a second element separated by a cavity, the two elements respectively comprising two different electrically conductive materials, and said integrated structure comprises contact detection means configured to detect an electrical contact between the two elements upon a temperature rise.

Upon a temperature rise, some materials expand, which makes it possible to form an electrical contact between two elements separated by a cavity for example at ambient temperature.

The use of two different materials notably makes it possible to prevent the formation of covalent links between the two elements upon a temperature rise. To this end, it is possible to choose two different conductive materials which are not miscible, or which are miscible only when the temperature is very high, for example of the order of 1000° C. Thus, when the temperature drops after a temperature rise, the two elements have not formed covalent, or mechanical, links, and the two elements separate. The cavity initially present, because one of the two elements is not flush with the assembled surface, is then formed once again and there is no longer any electrical contact between the two elements.

It can be noted that, by using two different materials, the two elements form a switch which is in the closed position upon a temperature rise, and which is open when the temperature is low or when the temperature drops back after a temperature rise. Such a switch can therefore be reused and can indicate a plurality of successive temperature rises, without remaining in a closed position.

The first bump contacts can be arranged in the same plane as the highest level of metallization of the first integrated circuit and the second bump contacts are situated in the same plane as the highest level of metallization of the second integrated circuit. It is possible to produce the bump contacts when producing this level of metallization, which may, for example, comprise copper lines. All the bump contacts, except for at least one of the bump contacts (which will comprise a different material and, possibly, a cavity), can be produced in a conventional manner, for example during the implementation of a single or double damascene-type process well known to the person skilled in the art.

It is also possible to note that the contact detection means configured to detect an electrical contact between the two elements upon a temperature rise can be linked to the two elements by using the interconnect networks of the two integrated circuits, and without modifying the structure.

The different electrically conductive materials of the two elements can have different thermal expansion coefficients. One of the two materials may, for example, expand to at least partially fill the cavity separating the two elements, while the other, having a lower thermal expansion coefficient, does not expand. An expansion of the two materials that might provoke mechanical stresses at the interface between the two integrated circuits is, moreover, avoided.

The second element, that is to say a bump contact of the second integrated circuit which is not flush with the assembled surface, may have, in the vicinity of the first face of the insulating region of the second integrated circuit, a surface in the form of a dish or set back relative to the first face of the insulating region of the second integrated circuit, and the first element, that is to say a bump contact flush with the assembled surface, may have, in the vicinity of said first face of the insulating region of the first integrated circuit, a protuberant or flat surface.

Surfaces in the form of a dish can be obtained by implementing mechanochemical polish-type methods during which a phenomenon well known to the person skilled in the art as "dishing" occurs. Furthermore, it is possible to obtain a surface that is set back by means of a photolithoengraving step and a flat or protuberant surface can also be obtained by a mechanochemical polishing.

The use of a so-called selective mechanochemical polishing is particularly advantageous. Such a polishing can be implemented to form dishes in all the bump contacts comprising copper of an integrated circuit, while retaining a flat surface for a bump contact comprising another material. The bump contact of another integrated circuit, comprising, for example, copper in dish form, will then form the element which expands to partially fill the dish and form an electrical contact with the element comprising another material.

The second element, that is to say a bump contact of the second integrated circuit which is not flush with the assembled surface, is advantageously wider than the first element. Any undesirable electrical contact is thus avoided, notably between the barrier layers which partially encapsulate the bump contacts comprising electrically conductive materials.

One of the two elements may comprise copper, and another of the two elements may comprise tungsten or tungsten silicide ($WSi_2$). Obviously, all the other bump contacts may comprise copper and form conventional connections between the two integrated circuits.

BRIEF DESCRIPTION OF THE DRAWINGS

Other advantages and features of the invention will become apparent on studying the detailed description of production, taken as nonlimiting examples and illustrated by the appended drawings in which.

DETAILED DESCRIPTION OF THE DRAWINGS

Figure 1:
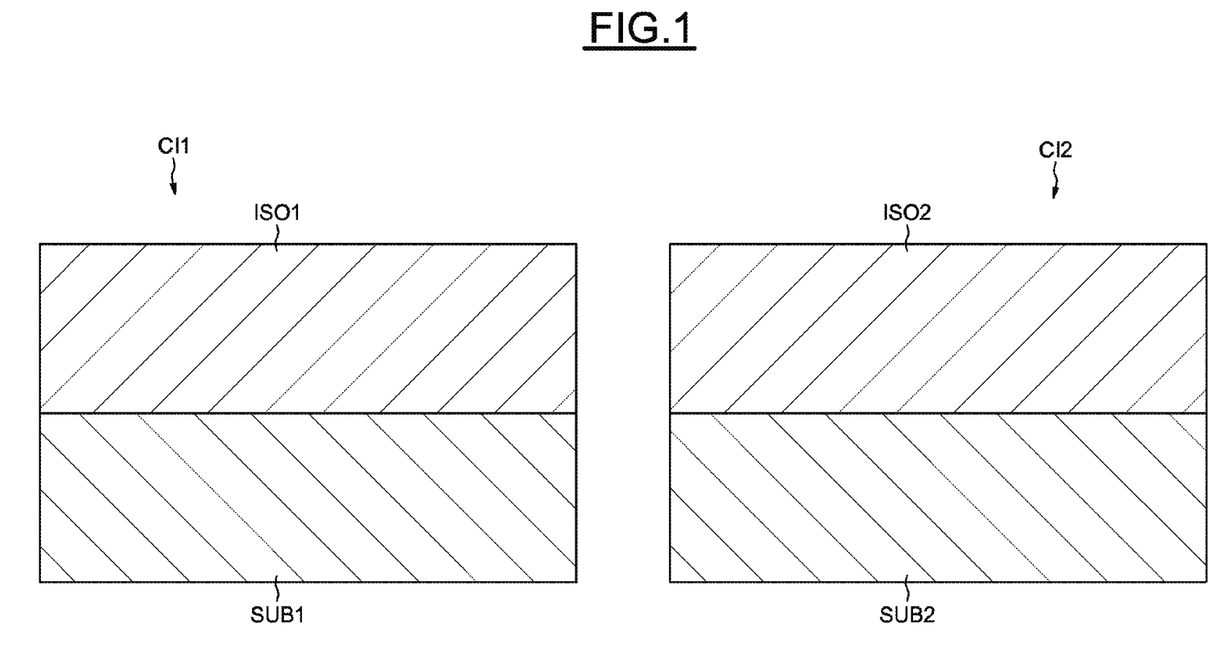
FIGS. 1 to 6 illustrate different steps in the fabrication of a three-dimensional integrated structure of an embodiment.

FIG. 1 shows two distinct integrated circuits CI1 and CI2 intended to be assembled. The integrated circuits CI1 and CI2 respectively comprise a substrate SUB1 and SUB2. On the substrates SUB1 and SUB2, insulating regions ISO1 and ISO2 have been formed. The insulating regions ISO1 and ISO2 may comprise interconnect networks of BEOL type which have not been represented here. Moreover, at this stage, the interconnect networks may comprise six or seven levels of metallization, the highest level of metallization, for example the seventh or the eighth, having not yet been produced.

Figure 2:
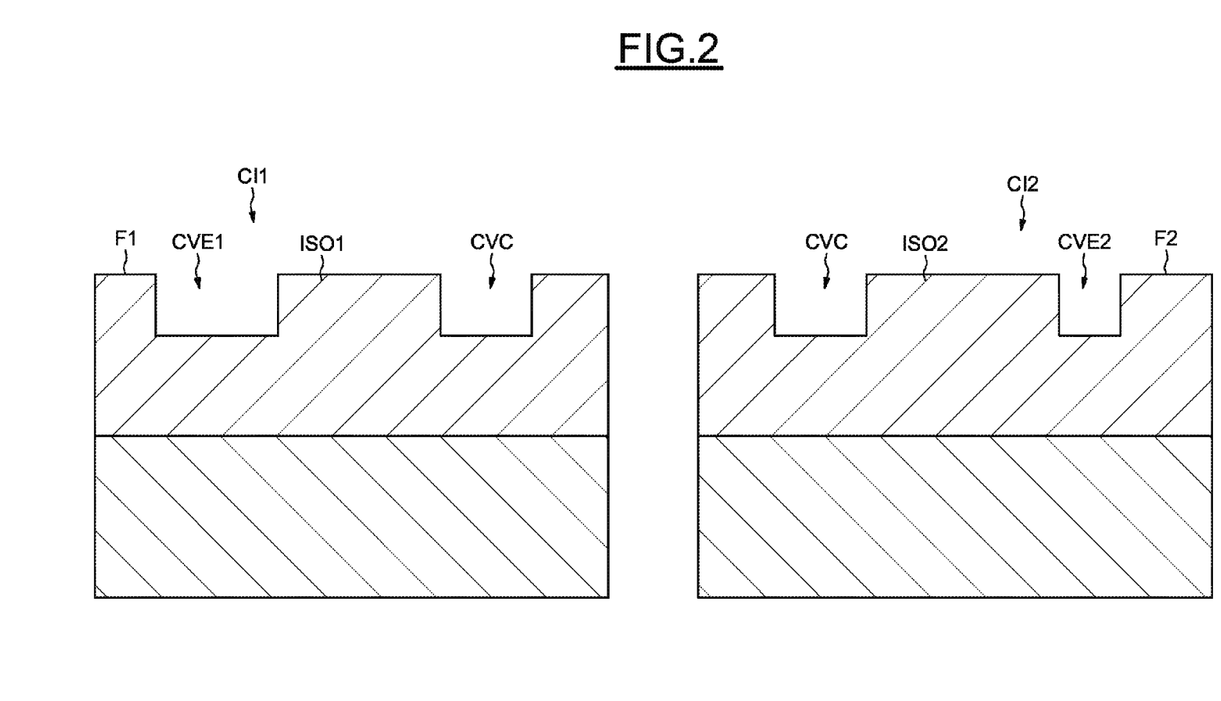

FIG. 2 shows the integrated circuits CI1 and CI2 after the formation of cavities on the free faces F1 and F2 of the insulating regions ISO1 and ISO2. More specifically, on the face F1 of the insulating region ISO1 of the integrated circuit CI1, two cavities have been formed, one cavity CVE1 intended to form, after filling, an element, and one cavity CVC intended to form, after filling, an electrically conductive bump contact which will form a permanent electrical connection with another electrically conductive bump contact, for example of the integrated circuit CI2. On the face F2 of the insulating region ISO2 of the integrated circuit CI2, there have been formed a cavity CVC similar to the cavity CVC of the integrated circuit CI1, and a cavity CVE2 intended to form, after filling, an element.

The cavities CVC, CVE1 and CVE2 have dimensions similar to those of metallic lines of the highest level of metallization of an integrated circuit, for example of the order of a micrometer wide and deep. Nevertheless, these cavities can have different widths. The cavity CVE1 may, notably, be wider, greater than a micrometer, and the cavity CVE2 may be less wide than the cavity CVE1.

Figure 3:
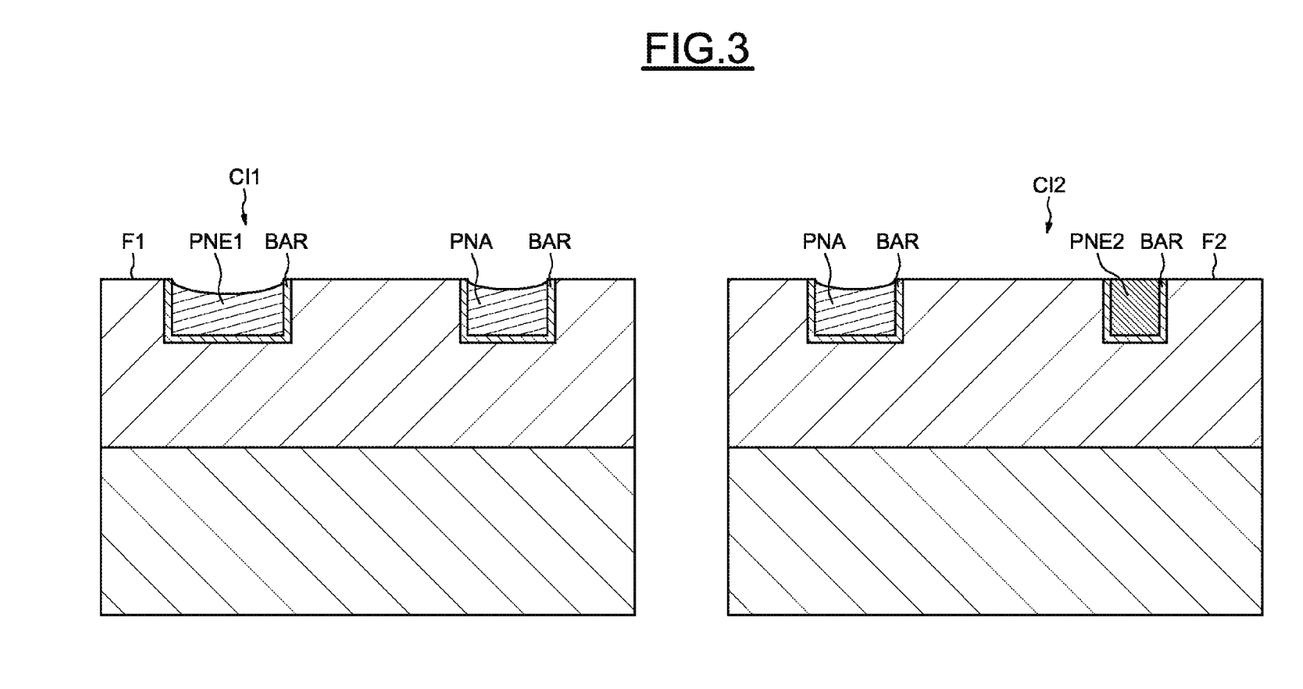

These cavities can then be filled with an electrically conductive material (FIG. 3). A region forming a barrier and an attachment layer BAR comprising, for example, tantalum nitride (TaN) and tantalum is first deposited on the bottom, on the walls of the cavities CVC, CVE1 and CVE2, and on the faces F1 and F2 although they have been removed in FIG. 3 in these parts.

All the cavities can be filled, except, for example, the cavity CVE2 described with reference to FIG. 2 with copper, and the cavity CVE2 can be filled with a different material, for example tungsten. To this end, the cavity CVE2 can be filled up with a resin during the filling of the other cavities. It is also possible to form the cavity CVE2 after the filling of the other cavities and then fill it.

After the filling, there are obtained non-assembled bump contacts PNA in the cavities CVC, a non-assembled bump contact intended to form an element PNE1 comprising copper in the cavity CVE1, and a non-assembled bump contact intended to form an element PNE2 comprising, for example, tungsten in the cavity CVE2.

Once the cavities are filled, the surfaces on which a conductive material has been deposited are polished so as to bare the faces F1 and F2. This polishing can be a mechanochemical polishing, even a selective mechanochemical polishing. After such a polishing, it is possible to obtain, by virtue of the "dishing" phenomenon, surfaces in the form of a dish for the non-assembled bump contacts PNA and also PNE1, that is to say the bump contacts comprising copper, and a planar surface for the non-assembled bump contact comprising, for example, tungsten. Selective chemical agents can be used during the mechanochemical polishing to obtain such a result, but the different mechanical properties of the two materials may also provoke the appearance of dishing in certain non-assembled bump contacts and of a planar surface for the other. The person skilled in the art knows how to adjust the parameters of a mechanochemical polishing step to obtain such reliefs (protuberances and/or cavities), notably the type of polishing solution used (or "slurry"), the hydrogen peroxide ($H_2O_2$) concentration of the polishing solution, the polishing solution flow rate, the pressure applied to the plate to be polished, the temperature and the type of polishing fabric. As an example, to obtain protuberances on a bump contact made of tungsten, it is possible to use the "Slurry 1501" polishing solution from Dow Chemical.

Figure 4:
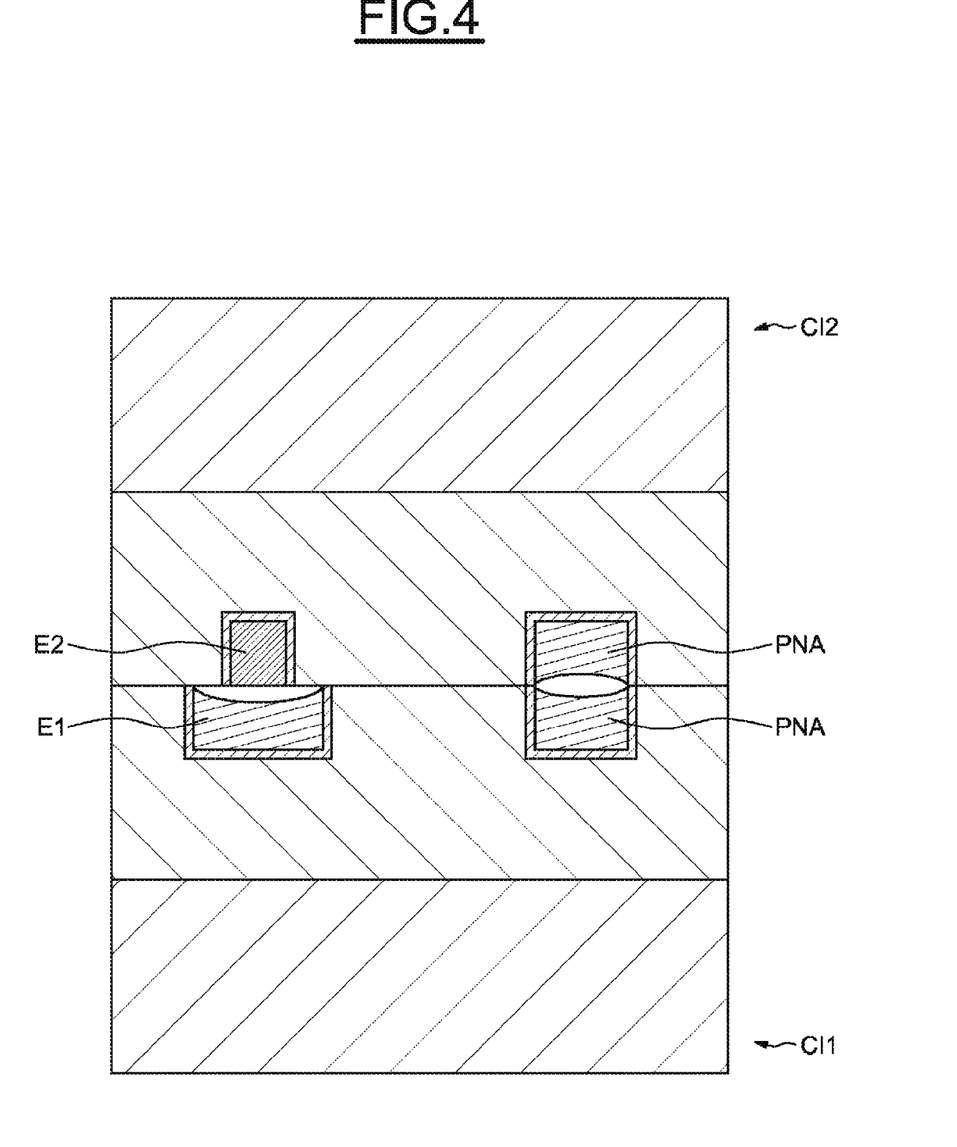

FIG. 4 shows the two integrated circuits CI1 and CI2 assembled so as to position the non-assembled bump contacts facing one another. This assembly is a direct or molecular bonding, that is to say a bonding without the addition of adhesive material. At this stage, it can be noted that there is no electrical connection between the bump contacts of the two integrated circuits, the non-assembled bump contacts PNA are separated by a cavity formed by their dished surfaces, and the bump contacts PNE1 and PNE2, now forming elements E1 and E2, are separated by the dished surface of the bump contact E1.

A bake can be implemented, at a temperature for example of the order of several hundred degrees Celsius, in order to form said electrical connections between the assembled copper bump contacts PA which expand under the effect of heat. Since the two materials are the same, once in contact, they form covalent links, which ensure the mechanical link between the two bump contacts.

It will be noted that the presence of a cavity is particularly advantageous, since it prevents an expansion of two bump contacts arranged facing one another which could provoke the appearance of mechanical stresses, even of fractures.

Figure 5:
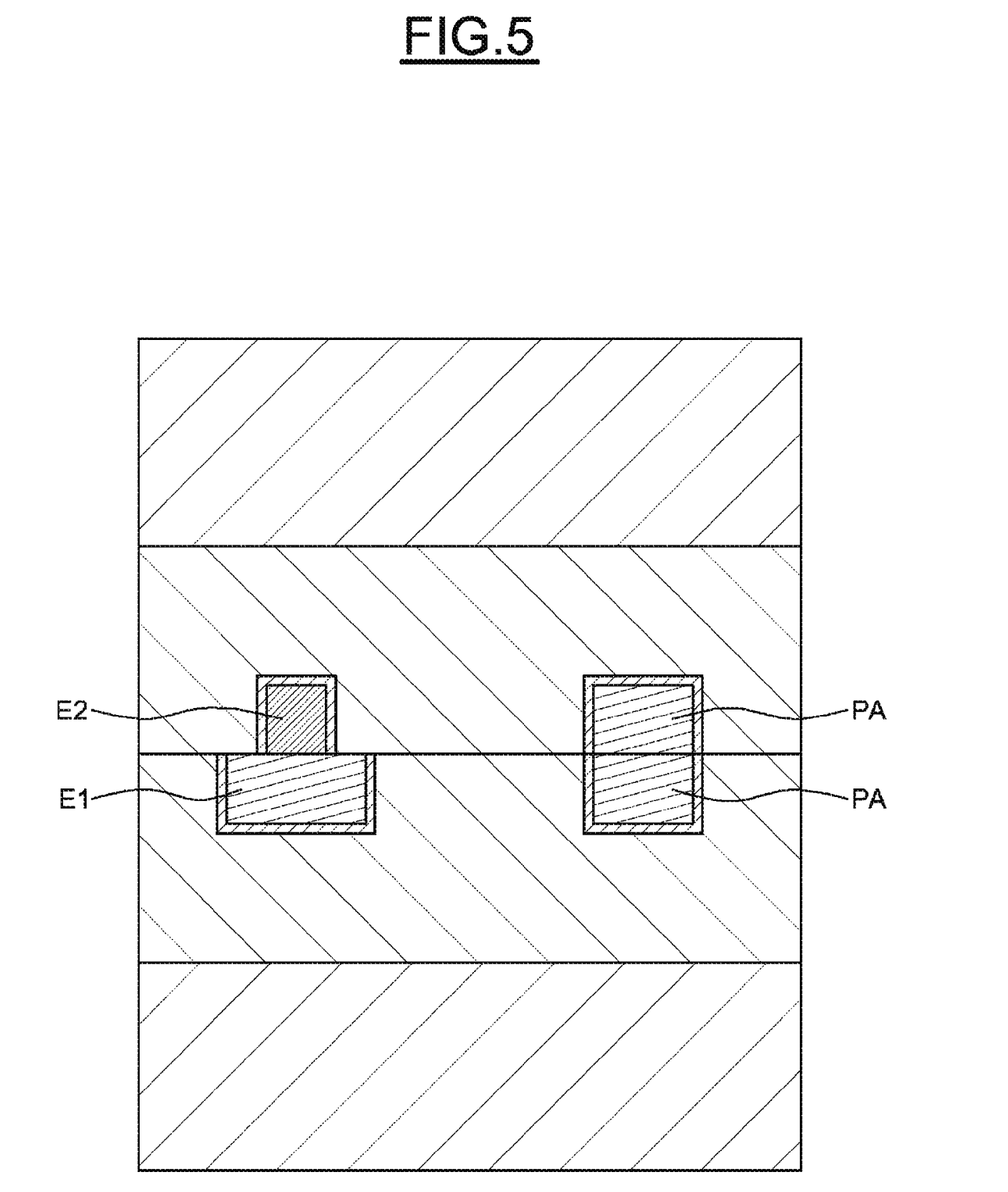

As illustrated in FIG. 5, during the bake, the elements E1 and E2 form an electrical contact, but the materials contained in these elements are chosen so as not to be miscible and not to form covalent links when the temperature is below a particularly high threshold, for example a thousand degrees Celsius. Such is notably the case for copper and tungsten.

Figure 6:
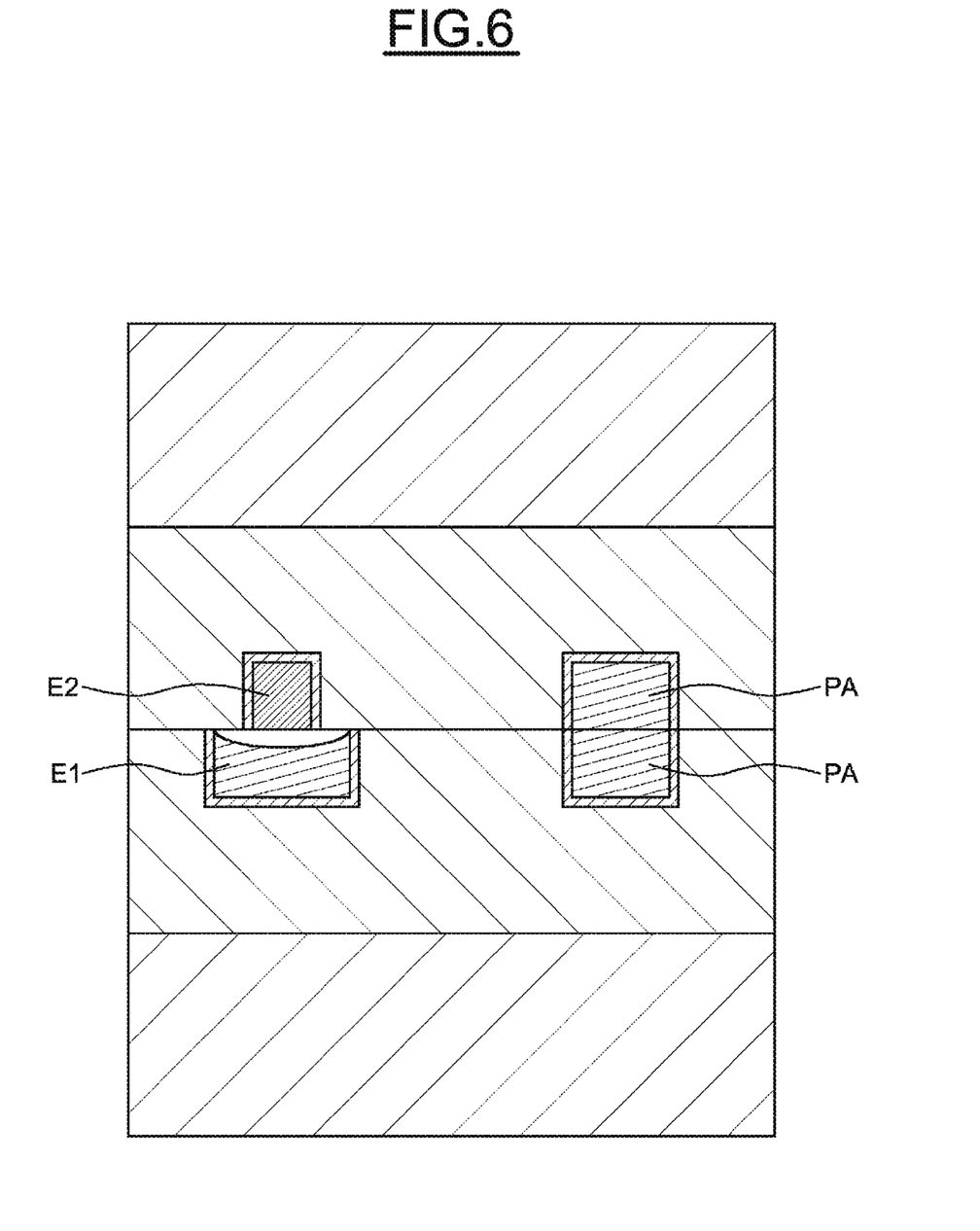

Thus, as illustrated in FIG. 6, once the bake is finished, the bump contacts PA remain mutually assembled, and the elements E1 and E2 are no longer in electrical contact, the copper having shrunk in cooling to form said dish.

In the example illustrated in FIG. 6, a three-dimensional integrated structure is obtained, in which all the bump contacts are flush with the surfaces F1 or F2 which are assembled. The surface of the bump contact forming an element E2 is also flush with these surfaces, but the surface of the bump contact forming an element E1 is dished, so there is a cavity between the elements E1 and E2. This cavity is filled up during a temperature rise by expansion of the copper, but the copper shrinks when the temperature drops back.

Figure 7:
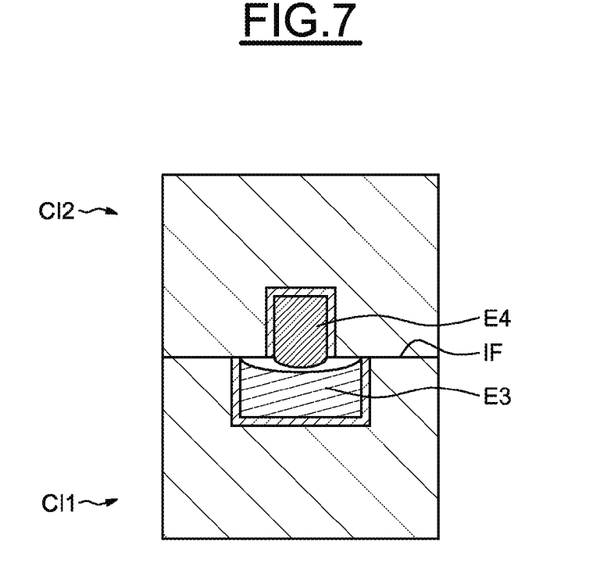
FIGS. 7 to 10 illustrate different embodiments.
Figure 8:
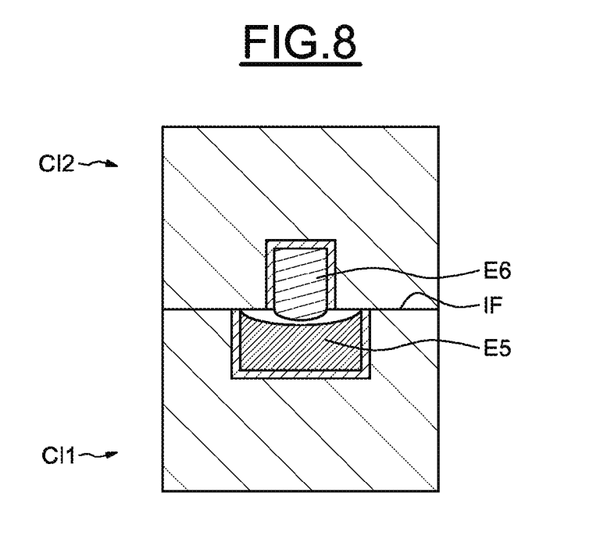
Figure 9:
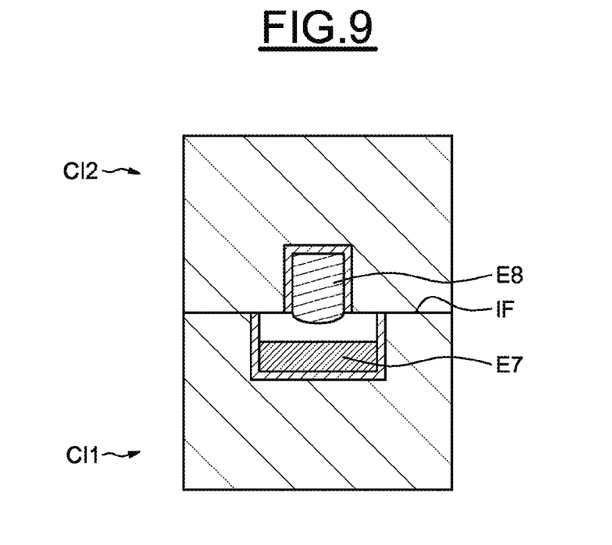

FIGS. 7 to 9 show different variants of bump contacts.

FIG. 7 shows two elements E3 and E4 arranged facing one another on either side of an interface IF between two integrated circuits CI1 and CI2. The element E3 here comprises copper, and has a form similar to that of the element E1 described with reference to FIG. 6. The element E4 comprises, for example, tungsten, but it has a protuberant surface. The electrical contact between the two elements is thus formed more rapidly during a temperature rise. It can be noted that it is possible to choose the dimensions of the dish and of the protuberance to avoid the occurrence of mechanical stresses.

In FIG. 8, it is the element E6 made of copper which has a protuberant surface, and the element E5 made of tungsten has a dished surface. In this variant, it is the element made of copper which is less wide than the element made of tungsten, in order to avoid any undesirable electrical contact.

In FIG. 9, an element made of tungsten E7 has also been formed, but prior to the assembly step, a photolithography step has been used to remove a portion of the element E7, so its surface is set back relative to the interface IF. The element E8 arranged facing the element E7 comprises copper and has a protuberant surface.

Figure 10:
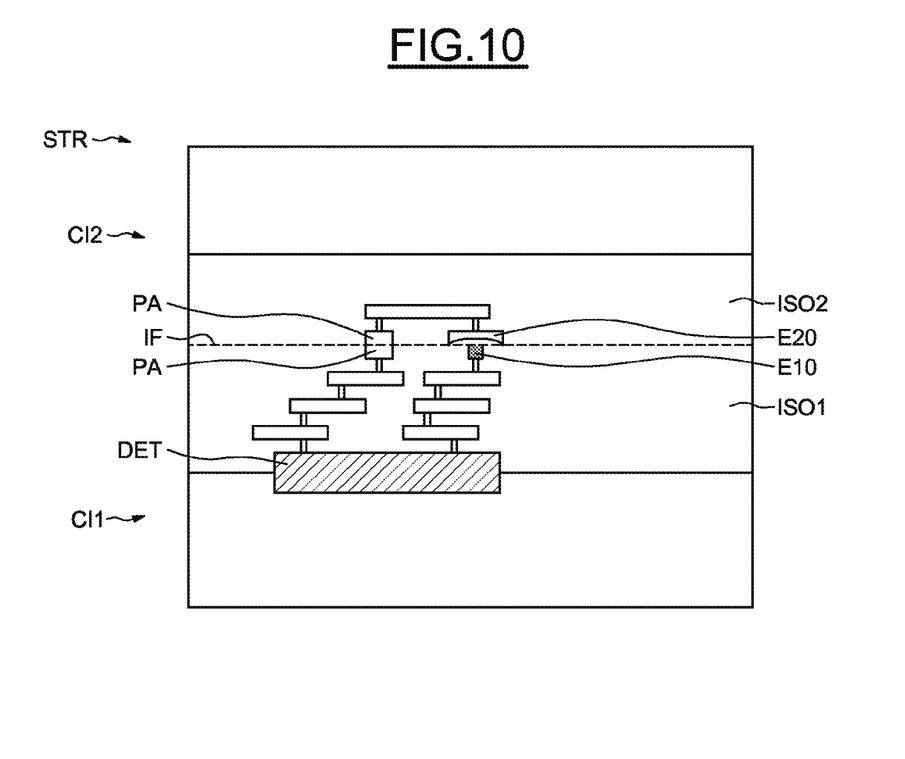

FIG. 10 shows a three-dimensional integrated structure STR comprising two integrated circuits CI1 and CI2. The integrated circuits CI1 and CI2 comprise insulating regions ISO1 and ISO2 that are directly bonded according to the interface IF. Also, a plurality of electrically conductive bump contacts are produced on either side of this interface. Furthermore, two elements E10 and E20 have been produced according to the steps described with reference to FIGS. 1 to 6. The element E20 comprises copper and a dished surface, and the element E10 comprises tungsten and a planar surface. The fabrication steps used to produce the elements E10 and E20 have been at least partially common to those used to produce other bump contacts, for example the bump contacts PA which form electrical connections at the interface IF.

Furthermore, four levels of metallization of the integrated circuit CI1 have been represented, the level comprising a bump contact PA and the element E10 being situated on the highest level, here the fourth. By using a network of lines and vias of the integrated circuit CI1 and of the integrated circuit CI2, it is possible to electrically link each element E10 and E20 to contact detection means DET, comprising, for example, a conventional circuit that is known per se capable of detecting the passage of a current or the presence of a voltage, for example using a logic circuit. The contact means DET are capable of detecting the formation of an electrical contact between the two elements E1 and E2. Such a contact occurs only when the temperature is raised. As an example, at approximately 200 degrees Celsius, the expansion of the copper can provoke an electrical contact.

It should be noted that the usual temperatures in an integrated circuit in operation are very much lower than 1000 degrees Celsius, and that, when the temperature drops, the two elements separate, and no mechanical contact keeps them in contact.

According to one aspect, means for detecting a temperature rise are obtained in a three-dimensional integrated structure, and with no significant changes to this structure. The filling of a cavity with a material other than copper makes it possible to obtain elements which form a switch that is closed only upon a temperature rise.

What is claimed is:

1. A three-dimensional integrated structure, comprising:
    a first integrated circuit including a plurality of first bump contacts formed in an insulating region of the first integrated circuit flush with a first face of the insulating region of the first integrated circuit,
    a second integrated circuit including a plurality of second bump contacts formed in an insulating region of the second integrated circuit, a first one of the second bump contacts flush with a first face of the insulating region of the second integrated circuit and a second one of the second bump contacts not flush with the first face of the insulating region of the second integrated circuit,
    wherein the two integrated circuits are mutually attached by the two first faces so that each first bump contact faces a second bump contact, said second one of the second bump contacts forming a first element and the facing first bump contact forming a second element, the first and second elements separated by a cavity,
    wherein the first and second elements respectively comprise two different electrically conductive materials, and
    a contact detection circuit configured to detect an electrical contact between the first and second elements upon a temperature rise.

2. The integrated structure according to claim 1, wherein the first bump contacts are arranged in a same plane as a highest level of metallization of the first integrated circuit and the second bump contacts are arranged in a same plane as a highest level of metallization of the second integrated circuit.

3. The integrated structure according to claim 1, wherein the different electrically conductive materials of the first and second elements have two different thermal expansion coefficients.

4. The integrated structure according to claim 1, wherein said second element has, in the vicinity of said first face of the insulating region of the second integrated circuit, a surface in the form of a dish relative to the first face of the insulating region of the second integrated circuit, and said first element has, in the vicinity of said first face of the insulating region of the first integrated circuit, a protuberant surface.

5. The integrated structure according to claim 1, wherein said second element has, in the vicinity of said first face of the insulating region of the second integrated circuit, a surface in the form of a dish relative to the first face of the insulating region of the second integrated circuit, and said first element has, in the vicinity of said first face of the insulating region of the first integrated circuit, a flat surface.

6. The integrated structure according to claim 1, wherein the second element is wider than the first element.

7. The integrated structure according to claim 1, wherein one of the first and second elements comprises copper and another of the first and second elements comprises tungsten.

8. The integrated structure according to claim 1, wherein one of the first and second elements comprises copper and another of the first and second elements comprises tungsten silicide.

9. An apparatus, comprising:
    a first integrated circuit including a top layer having a first cavity formed therein, said first cavity filled with a first conductive material;

a second integrated circuit including a top layer having a second cavity formed therein, said second cavity filled with a second conductive material different from the first conductive material;

wherein said first conductive material filled first cavity faces said second conductive material filled second cavity without making electrical contact with an open cavity between the first and second conductive materials to form a temperature sensor; and a sensing circuit electrically connected to the temperature sensor and configured to sense electrical contact between the first and second conductive material in response to a change in temperature of the first and second integrated circuits.

10. The apparatus of claim 9, wherein the first conductive material forms a flat surface substantially coplanar with a top surface of the top layer of the first integrated circuit, and wherein the second conductive material forms a concave surface recessed below a top surface of the top layer of the second integrated circuit.

11. The apparatus of claim 9, wherein the first conductive material forms a protruding surface above a top surface of the top layer of the first integrated circuit, and wherein the second conductive material forms a concave surface recessed below a top surface of the top layer of the second integrated circuit.

12. The apparatus of claim 9, wherein the top layers of the first and second integrated circuits each comprise a highest level of metallization of the respective first and second integrated circuit.

13. The apparatus as in claim 9, wherein the different first and second conductive materials have two different thermal expansion coefficients.

14. The apparatus of claim 9, wherein one of the first and second conductive materials comprises copper and another of the first and second conductive materials comprises tungsten.

15. The apparatus of claim 9, wherein one of the first and second conductive materials comprises copper and another of the first and second conductive materials comprises tungsten silicide.

16. An integrated circuit temperature sensor, comprising:

a first metallization layer including a first cavity filled with a first conductive material;

a second metallization layer including a second cavity filled with a second conductive material, said first conductive material filled first cavity facing said second conductive material filled second cavity without making electrical contact with an open cavity between the first and second conductive materials;

said first and second conductive materials having two different thermal expansion coefficients; and a contact sensing circuit electrically connected to the first and second conductive materials and configured to sense electrical contact made between the first and second conductive material in response to a change in temperature.

17. The integrated circuit temperature sensor of claim 16, wherein the first conductive material forms a flat surface substantially coplanar with a top surface of the first metallization layer, and wherein the second conductive material forms a concave surface recessed into a bottom surface of the second metallization layer.

18. The integrated circuit temperature sensor of claim 16, wherein the first conductive material forms a protruding surface above a top surface of the first metallization layer, and wherein the second conductive material forms a concave surface recessed into a bottom surface of the second metallization layer.

19. The integrated circuit temperature sensor of claim 16, wherein the second conductive material forms a protruding surface beyond a bottom surface of the second metallization layer, and wherein the first conductive material forms a concave surface recessed into a top surface of the first metallization layer.

* * * * *